(12) United States Patent  (10) Patent No.: US 7,732,929 B2
Otremba et al.  (45) Date of Patent: Jun. 8, 2010

(54) POWER SEMICONDUCTOR COMPONENT WITH SEMICONDUCTOR CHIP STACK IN A BRIDGE CIRCUIT AND METHOD FOR PRODUCING THE SAME

(75) Inventors: Ralf Otremba, Kaufbeuren (DE); Xaver Schloegel, Sachsenkam (DE)

(73) Assignee: Infineon Technologies AG, Munich (DE)

( * ) Notice: Subject to any disclaimer, the term of this patent is extended or adjusted under 35 U.S.C. 154(b) by 326 days.

(21) Appl. No.: 11/562,051

(22) Filed: Nov. 21, 2006

(65) Prior Publication Data

US 2007/0132079 A1  Jun. 14, 2007

(30) Foreign Application Priority Data

Nov. 21, 2005  (DE) .................. 10 2005 055 761

(51) Int. Cl.
  *H01L 25/07* (2006.01)
  *H01L 23/48* (2006.01)
  *H01L 23/52* (2006.01)

(52) U.S. Cl. .................. 257/777; 257/177; 257/686; 257/724; 257/E23.01; 257/E23.141; 257/E25.013

(58) Field of Classification Search .................. 257/666, 257/676, 670, 692, 698, 731, 732, 777, 686, 257/177, 180, 181, 182, 724, E25.013, E25.014, 257/E23.01, E23.011, E23.141
See application file for complete search history.

(56) References Cited

U.S. PATENT DOCUMENTS

| 5,532,512 | A | * | 7/1996 | Fillion et al. ................. 257/686 |
| 6,031,279 | A |   | 2/2000 | Lenz |
| 6,700,793 | B2 | * | 3/2004 | Takagawa et al. ........... 361/777 |
| 6,706,557 | B2 |   | 3/2004 | Koopmans |
| 6,774,466 | B1 | * | 8/2004 | Kajiwara et al. ............. 257/673 |
| 6,927,483 | B1 | * | 8/2005 | Lee et al. ..................... 257/676 |
| 6,946,740 | B2 | * | 9/2005 | Schaffer ..................... 257/777 |
| 7,030,317 | B1 | * | 4/2006 | Oman ......................... 174/541 |
| 7,061,122 | B2 | * | 6/2006 | Kim et al. .................... 257/778 |
| 7,291,869 | B2 | * | 11/2007 | Otremba ..................... 257/107 |
| 7,372,142 | B2 | * | 5/2008 | Ferrara et al. ............... 257/691 |
| 2002/0074637 | A1 |   | 6/2002 | McFarland |
| 2004/0089934 | A1 | * | 5/2004 | Shimoida et al. ............ 257/686 |

FOREIGN PATENT DOCUMENTS

| DE | 19635582 | 2/1998 |
| DE | 102004019443 | 8/2005 |
| DE | 19835265 | 11/2005 |
| DE | 102004021054 | 11/2005 |
| JP | 2002343930 | 11/2002 |
| WO | 2005101504 | 10/2005 |

* cited by examiner

*Primary Examiner*—Jerome Jackson, Jr.
*Assistant Examiner*—Yu Chen
(74) *Attorney, Agent, or Firm*—Banner & Witcoff, Ltd.

(57) ABSTRACT

A power semiconductor component (30) with power semiconductor chip stack (14) has a base power semiconductor chip (16) and a power semiconductor chip (17) stacked on the rear side of the base power semiconductor chip (16), a rewiring structure for the electrical coupling of the power semiconductor chips being arranged within the rear side metallization.

15 Claims, 3 Drawing Sheets

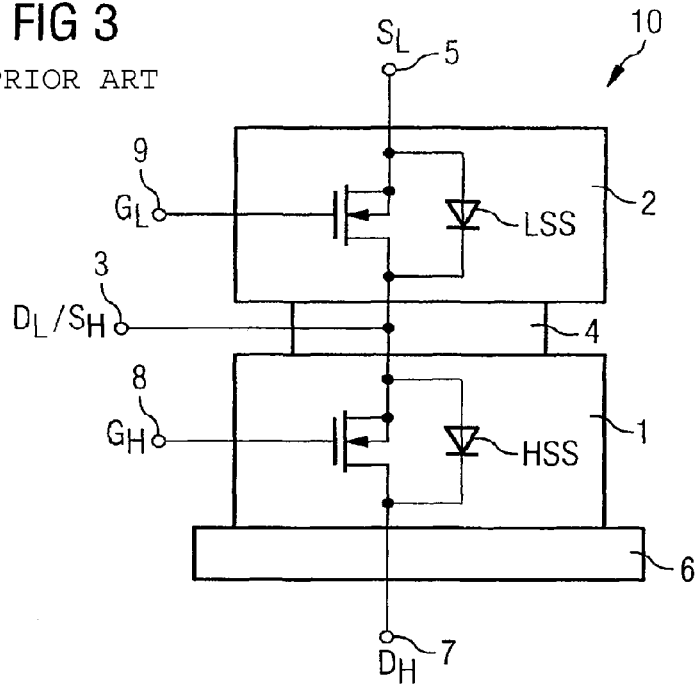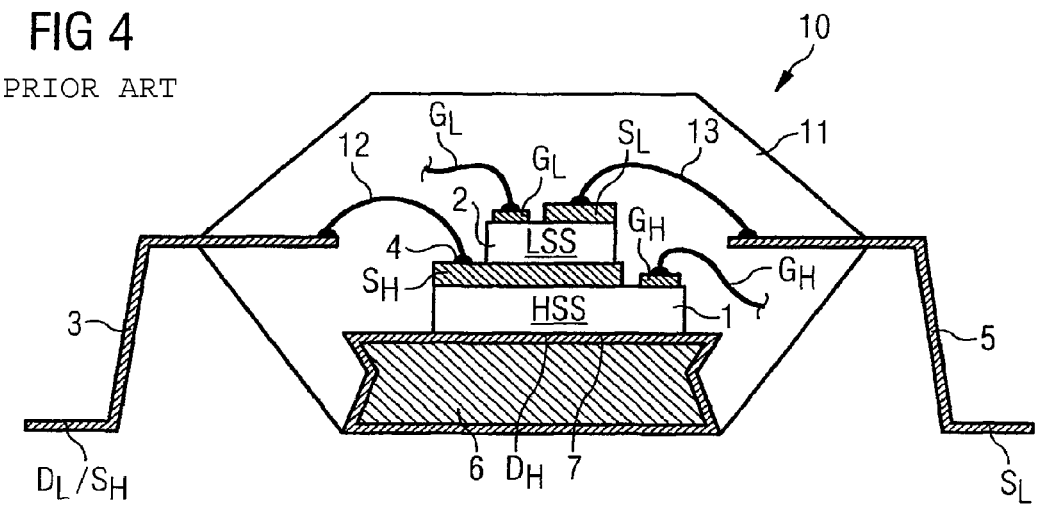

POWER SEMICONDUCTOR COMPONENT WITH SEMICONDUCTOR CHIP STACK IN A BRIDGE CIRCUIT AND METHOD FOR PRODUCING THE SAME

RELATED APPLICATION

This application claims priority from German Patent Application No. DE 10 2005 055 761.9 which was filed on Nov. 21, 2005, and is incorporated herein by reference in its entirety.

TECHNICAL FIELD

The invention relates to a power semiconductor component with semiconductor chip stack in a bridge circuit and a method for producing the same. For this purpose, the power semiconductor component has power field effect transistors as high-side switch and low-side switch, the power semiconductor component having a base power semiconductor chip with large-area external electrodes on the top side and rear side and carrying at least one stacked power semiconductor chip.

BACKGROUND

The document DE 196 35 582 C1 discloses such a power semiconductor component with a bridge circuit having at least one high-side switch (HSS) and at least one low-side switch (LSS), which component has a first base power semiconductor chip containing a vertical first transistor. A further second power semiconductor chip having a second vertical transistor is mounted on the first base power semiconductor chip so that the conduction paths of the two transistors are connected in series. An arrangement of this type is shown by FIGS. 3 and 4.

FIG. 3 shows a conventional bridge circuit 10 of power semiconductor chips 1 and 2, the base power semiconductor chip 1 being mounted on a heat sink 6 and having a high-side switch HSS. The drain connection 7 of the high-side switch HSS forms the rear side of the base power semiconductor chip 1, which is mounted on the heat sink 6. A further power semiconductor chip 2 is stacked as a low-side switch LSS on the source area at the top side of the base power semiconductor chip 1.

For this purpose, the drain region of the low-side switch LSS is mounted on the source region of the high-side switch HSS and forms the node 4, which can be connected via the external connection 3. The source region of the low-side switch LSS can likewise be contact-connected via the external connection 5 by bonding. The external connections 8 and 9 serve for driving the respective switches HSS and LSS of the bridge circuit.

One realization of the bridge circuit 10 is shown in FIG. 4, in the case of which the bridge circuit 10 is arranged in a housing 11 with external leads as external connections 3 and 5. In this case, the source area $S_H$ of the high-side switch HSS situated at the surface of the base power semiconductor chip 1 is larger than the power semiconductor chip 2 stacked on it. As a result, the contact-connection can be effected via the contact area at the node 4 in a simple manner by means of bonding wire 12 to the external lead connection 3. The source area $S_L$ of the semiconductor chip 2 is also connected to the other external lead contact 5 from above likewise by means of a bonding wire 13.

What is disadvantageous in the case of this bridge circuit 10 is that the drain connection basic area of the low-side switch LSS, which is realized as a stacked power semiconductor chip 2, is smaller than the source contact area of the high-side switch HSS in the base power semiconductor chip 1. This is associated with the disadvantage that the permissible current consumption of the bridge circuit branch 10 is significantly restricted by the reduced size of the stacked power semiconductor component 2.

Such a bridge circuit with a high-side switch as base chip is disadvantageous especially as, in a bridge circuit of this type, the larger current flow is to be switched through the low-side switch and it is not possible to effect problem-free linking to a thermal sink with a corresponding heat sink for dissipating the heat loss in the known circuit construction.

SUMMARY

A power semiconductor component may comprise a power semiconductor chip stack, the power semiconductor chip stack comprising a base power semiconductor chip and a power semiconductor chip stacked on the rear side of the base power semiconductor chip, and a rewiring structure being arranged within a rear side metallization of the base power semiconductor chip.

BRIEF DESCRIPTION OF THE DRAWINGS

The invention will now be explained in more detail with reference to the accompanying figures.

FIG. 3 shows a bridge circuit of power semiconductors which is known from the prior art; and FIG. 4 shows a realization of the bridge circuit in accordance with FIG. 3 with a power semiconductor chip stack.

DETAILED DESCRIPTION

Figure 1:
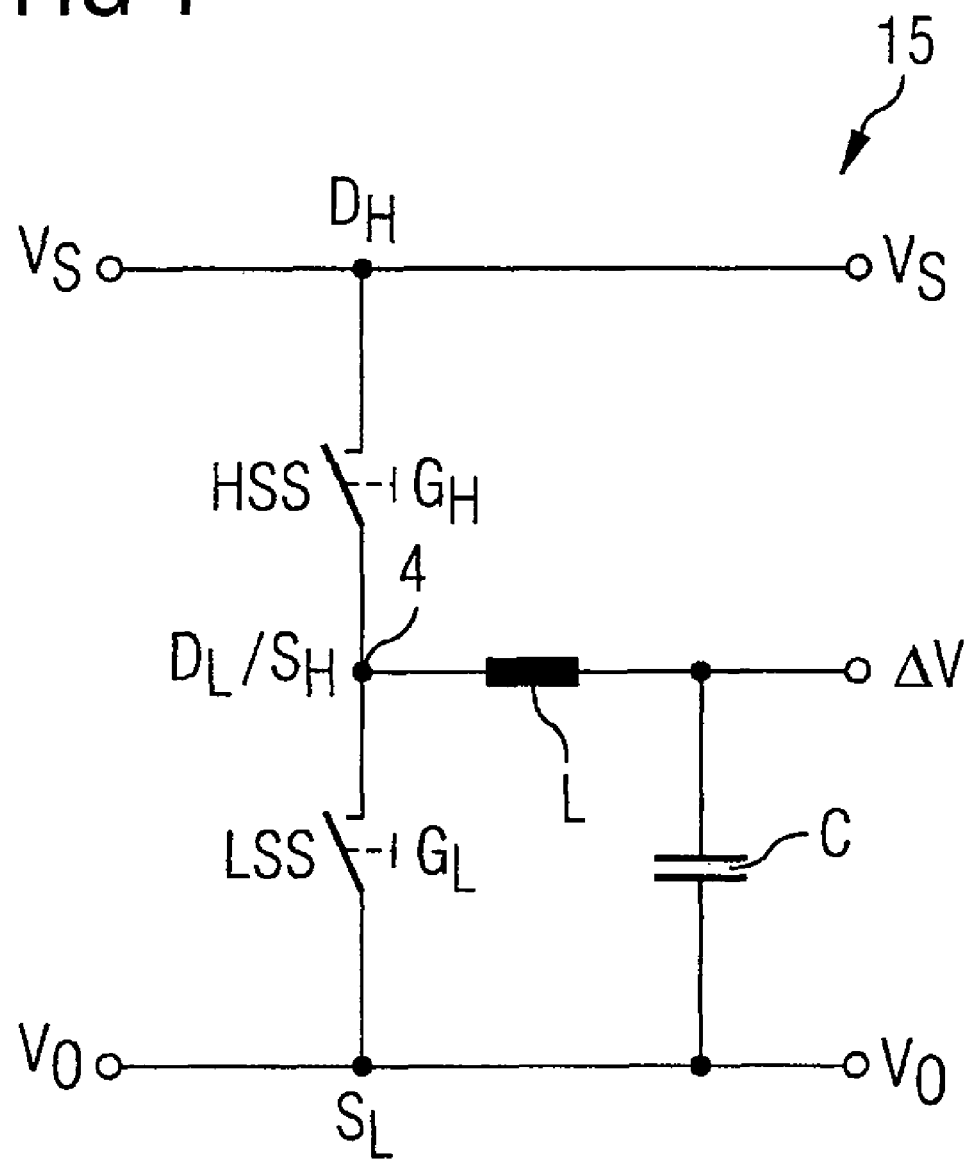
FIG. 1 shows a schematic basic circuit of a bridge circuit.

In one embodiment, a power semiconductor component is provided with a power semiconductor chip stack preferably comprising a low-side switch and a high-side switch in a bridge circuit. In one embodiment, the power semiconductor chip stack preferably has the low-side switch as the base power semiconductor chip and the high-side switch as the stacked power semiconductor chip, on the rear side of the low-side switch a rewiring structure being arranged within the rear side metallization, preferably as wiring film or as wiring plate for a series circuit of the switches.

In one embodiment, the stacked power semiconductor chip can advantageously be electrically coupled to the base power semiconductor chip via this rewiring structure on the rear side of the base power semiconductor chip. This coupling of the power semiconductor switches in the power semiconductor chip stack has the advantage that the low-side switch, which switches the larger current, is now arranged with its electrodes on the underside of the power semiconductor component and can thus be directly connected to a heat sink, with the result that intensive heat dissipation of the heat loss is ensured in the case of this power semiconductor component.

In one embodiment, the low-side switch and the high-side switch are preferably vertical power field effect transistors with source, drain and gate electrodes. In one embodiment, the power field effect transistors have the advantage that they have a large-area source electrode and a small-area gate electrode on a top side, while a large-area drain electrode is arranged on the opposite rear side. In this context, large-area is understood to mean an electrode which virtually or completely covers the entire rear side or top side of a semiconductor chip. Small-area electrodes are understood to mean the gate electrode that has only a slight areal extent and thus can be arranged on the remaining area of a top side of such a power semiconductor chip.

In one embodiment, the wiring film or wiring plate between the stacked power semiconductor chips preferably has a large-area drain contact pad on its underside for the drain electrode of the base power semiconductor chip and at least two contact pads as source and gate contact pads for the source and gate electrodes, respectively, on its top side. In this case, the drain contact pad and the source contact pad are electrically connected to one another via through contacts through the wiring film or wiring plate and form a circuit node of a bridge circuit.

What is achieved by means of said wiring film, which is practically arranged as a so-called "interposer" between the base semiconductor chip and the stacked semiconductor chip, is that the base semiconductor chip is connected by its large-area drain electrode to the source electrode of the stacked power semiconductor chip to form a circuit node. Moreover, the large-area source electrode of the base power semiconductor chip and its small-area gate electrode can be arranged on the underside of the power semiconductor chip and be contact-connected from there in so-called "source down mounting". The application of the chip rear side as rewiring is also advantageous for other types of semiconductor components such as e.g. for logic and memory products with CoC stacks (chip on chip).

In one embodiment, the underside of the power semiconductor component has at least three large-area and two smaller surface-mountable external lead connections. In one embodiment, these external lead connections are arranged in a manner distributed over the underside of the power semiconductor component. In this case, a large-area source external lead connection is electrically connected to the source electrode of the base power semiconductor chip and a large-area drain external lead connection is electrically connected to the drain electrode of the stacked semiconductor chip, and a large area drain/source external lead connection is electrically connected to the wiring film. In one embodiment, the two smaller surface-mountable external lead connections are in each case electrically connected to the gate electrodes of the power semiconductor chips of the power semiconductor chip stack.

In one embodiment, the source electrode of the base power semiconductor chip is directly fixed on the large-area source external lead connection. Intensive heat dissipation of the heat loss that arises in the low-side switch is thus possible.

Furthermore, one embodiment provides for an internal connecting element, preferably a connecting strip or a preformed, structured connecting plate, as a clip, electrically to connect the drain electrode of the stacked power semiconductor chip to the large-area drain external lead connection. Such clip connecting elements within the power semiconductor component for the drain electrode of the stacked power semiconductor chip have the advantage that the topmost large-area electrode of the power semiconductor chip stack can now be contact-connected via such a clip from the underside of the power semiconductor component.

Furthermore, in one embodiment, the gate electrode of the base power semiconductor chip is directly fixed on one of the smaller surface-mountable external lead connections. This fixing is possible by virtue of the fact that the gate electrode of the low-side switch, which in this case constitutes the control electrode of the base power semiconductor chip, is oriented towards the underside of the power semiconductor component.

In one embodiment, it can be provided that the second one of the small-area surface-mountable external lead connections is electrically connected to the gate electrode of the stacked power semiconductor chip via a connecting element, preferably via a bonding wire. Since only signal currents and control pulses pass via such a gate electrode, the cross section of a standard bonding wire completely suffices for connecting the gate electrode of the stacked power semiconductor chip to an external lead connection arranged on the underside of the power semiconductor component.

Finally, in a further embodiment, the power semiconductor chip stack, the wiring film or the wiring plate, the connecting elements and the top sides and also edge sides of the external lead connections are embedded into a plastic housing composition. This embedding into a plastic housing composition proves to be simpler and more cost-effective in terms of production engineering than the provision of a cavity housing that is usually provided for power semiconductor components.

In one embodiment, a method for producing a plurality of power semiconductor components may have the following method steps. Firstly, a leadframe with a plurality of power semiconductor component positions is produced. Three large-area and two smaller surface-mountable external lead connections are arranged in said power semiconductor component positions. The large-area external lead connections are provided for the source electrode of the base semiconductor chip, for the drain electrode of the stacked semiconductor chip and for the node on the wiring film for a drain/source external lead connection. The two smaller surface-mountable external lead connections are in each case reserved for the gate external lead connections.

In one embodiment, after the completion of the leadframe with power semiconductor component positions correspondingly arranged in rows and/or columns, base power semiconductor chips are fixed onto said power semiconductor component positions by their source electrodes and their gate electrodes on one of the large-area source external lead connections and onto one of the small-area gate external lead connections. In one embodiment, afterwards, a wiring film or wiring plate is mounted onto the top side of said base power semiconductor chip by a drain contact pad on the drain electrode of the base power semiconductor chip.

In one embodiment, this mounting may be a soldering connection for an adhesive connection. In one embodiment, a stacked power semiconductor chip is subsequently applied to the wiring film or the wiring plate by its source electrode and its gate electrode onto corresponding large-area source contact pads and smaller gate contact pads of the wiring film or the wiring plate. As a result, the power semiconductor chip stack is practically completed and it is now possible to fit the individual connecting elements between the wiring film or wiring plate and the external lead connections.

Furthermore, in one embodiment, it is possible to effect the connecting elements between the drain electrode of the stacked power semiconductor chip and the large-area external lead connection. Finally, the power semiconductor chip stack with its connecting elements and the wiring film or the wiring plate and also the top sides and edge sides of the external lead connections are embedded into a plastic housing composition. In one embodiment, only the rear sides of the external lead connections are then available as surface-mountable external contact areas for surface mounting. Finally, the leadframe is separated into individual power semiconductor components with corresponding bridge circuits.

This method has the advantage that all the production steps can be carried out for a plurality of power semiconductor components in a parallel method. Furthermore, this method has the advantage that it yields a novel semiconductor bridge circuit comprising power semiconductor chips which, given the same dimensions such as are known from the prior art, can now switch external currents, however.

To summarize, it can be stated that, by means of the arrangement of the power semiconductor chips in the power semiconductor chip stack disclosed here, the semiconductor chip area of the low-side switch as base power semiconductor chip can be significantly increased since said low-side switch can be arranged on the underside of the power semiconductor component by means of so-called "source down mounting", and the high-side switch, subjected to less loading, is thus also arranged as a stacked power semiconductor chip in the power semiconductor chip stack. In particular, the power semiconductor chip rear side of the base power semiconductor chip is advantageously utilized for realizing a wiring plane with separate metallization planes arranged thereon, this rewiring plane on the chip rear side enabling a CoC arrangement (chip on chip) or "source down mounting".

FIG. 1 shows a schematic basic circuit of a bridge circuit 15 having two vertical semiconductor power transistors, said transistors being arranged as high-side switch HSS and as low-side switch LSS between a supply voltage $V_S$ and a ground potential $V_0$ in a series circuit. For this purpose, the high-side switch HSS is connected by its drain electrode $D_H$ to the supply voltage $V_S$ and is switched with the aid of its gate electrode $G_H$.

The source electrode $S_H$ of the high-side switch HSS forms, together with the drain electrode $G_L$ of the low-side switch LSS, a serial node 4, which is connected to the ground potential $V_0$ via the low-side switch LSS with the source electrode $S_L$ thereof if the gate electrode $G_L$ turns on the low-side switch LSS. The node 4 comprising the drain electrode of the low-side switch LSS and the source electrode of the high-side switch HSS is connected to a voltage output $\Delta V$ via a low-pass filter comprising an inductance L and a smoothing capacitor C. The subsequent FIG. 2 shows the implementation of this bridge circuit into a power semiconductor component.

Figure 2:
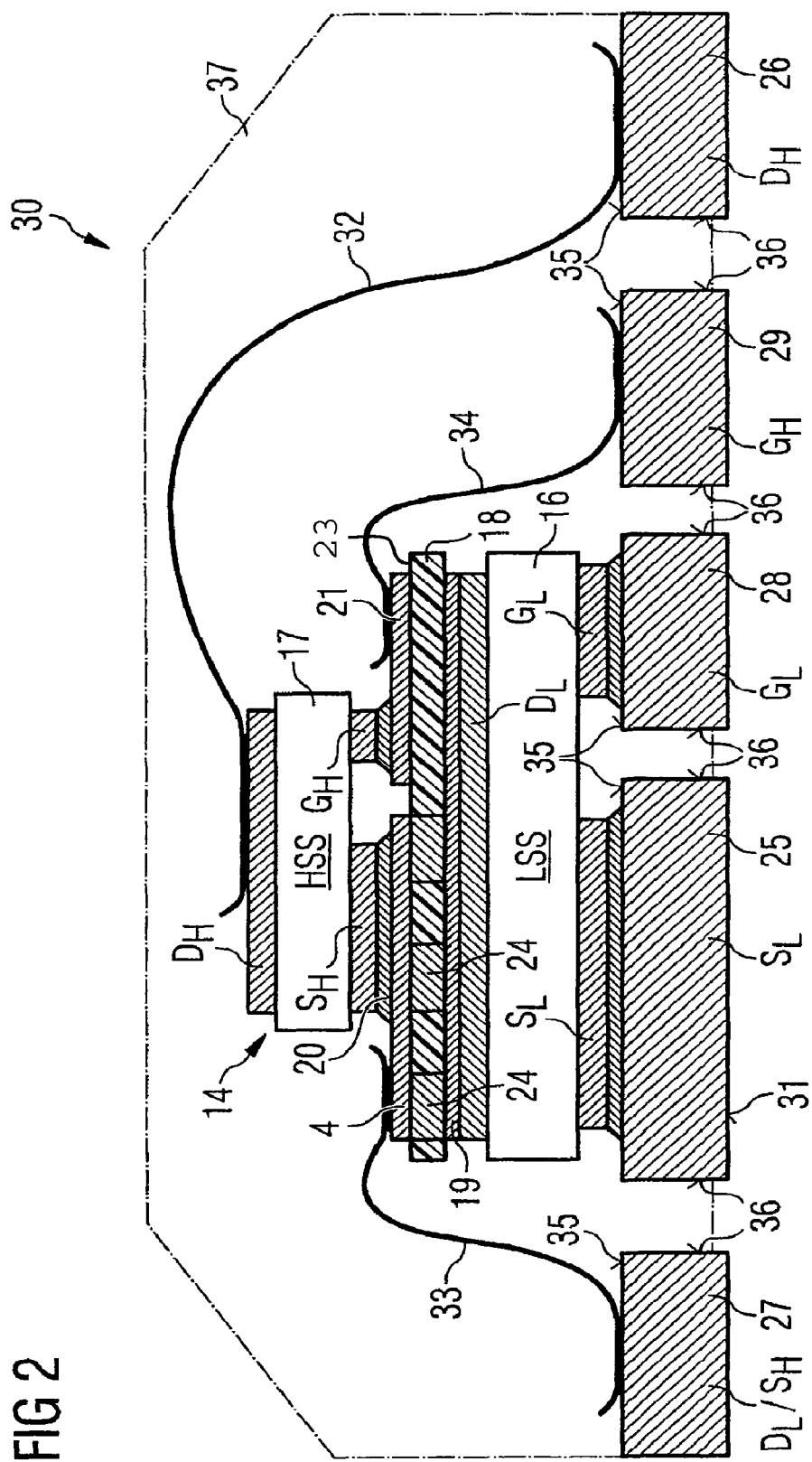
FIG. 2 shows a schematic cross section of the power semiconductor component of one embodiment of the invention with a bridge circuit.

FIG. 2 shows a schematic cross section of a power semiconductor component 30 of one embodiment of the invention with a half-bridge 15 as shown in FIG. 1. This power semiconductor component 30 has a power semiconductor chip stack 14 having a base power semiconductor chip 16 and a stacked semiconductor chip 17. A wiring film 18 or wiring plate having a multilayer rewiring structure is arranged between the base power semiconductor chip 16 and the stacked semiconductor chip 17.

Said wiring film 18 connects the drain electrode $D_L$ of the low-side switch LSS via a drain contact pad 19 and through contacts 24 through the wiring film 18 to a source contact pad 20 on the top side 23 of the wiring film 18 for the source electrode $S_H$ of the high-side switch HSS. In addition, the top side 23 of the wiring film 18 has a gate contact pad 21, which is electrically connected to the gate electrode $G_H$ of the high-side switch HSS of the stacked semiconductor chip 17. Two internal connecting elements 33 and 34 proceed from the wiring film 18, the connecting element 33 connecting the node 4 to a common lead connection 27 for the drain electrode $D_L$ of the low-side switch LSS and the source electrode $S_H$ of the stacked high-side switch HSS.

Moreover, the internal connecting element 34 in the form of a bonding wire connects the gate electrode $G_H$ of the high-side switch via the gate contact pad 21 to the external lead connection 29 on the underside 31 of the power semiconductor component 30. A further internal connection 32 connects, in large-area fashion, the drain electrode $D_H$ of the high-side switch HSS to a large-area external lead connection 26 for the drain electrode $D_H$ on the underside 31 of the power semiconductor component 30.

Furthermore, the power semiconductor component 30 has two further surface-mountable external lead connections on its underside 31, a large-area external lead connection 25 being directly connected to the source electrode $S_L$ of the low-side switch LSS of the base power semiconductor chip 16 and a small-area external lead connection 28 being directly connected to the gate electrode $G_L$ of the low-side switch LSS of the base power semiconductor chip 16. The power semiconductor chip stack 14 with the connecting elements 32, 33 and 34 is embedded into a plastic housing composition 37, which also encapsulates the edge sides 36 and the top sides 35 of the external lead connections 25 to 29 and does not wet the undersides of the external lead connections 25 to 29.

This arrangement enables the low-side switch LSS to be cooled by its source electrode $S_L$ directly by means of a large-area external lead connection 25. Furthermore, the low-side switch LSS via which the larger current flow is conducted in the case of such half-bridge circuits can be made larger in terms of its areal extent than is possible in the case of the previous circuit arrangements in accordance with FIGS. 3 and 4, such as are known from the prior art.

LIST OF REFERENCE SYMBOLS

1 Base semiconductor chip (prior art)
2 Stacked power semiconductor chip
3 External connection
4 Node
5 External connection
6 Heat sink
7 Drain connection
8 Gate external connection
9 Gate external connection
10 Half-bridge circuit
11 Housing
12 Bonding wire
13 Bonding wire
14 Power semiconductor chip stack
15 Bridge circuit
16 Base semiconductor chip
17 Stacked power semiconductor chip
18 Wiring film or wiring plate
19 Drain contact pad
20 Source contact pad
21 Gate contact pad
22 Underside of the wiring film
23 Top side of the wiring film
24 Through contact of the wiring film
25 Large-area external lead connection
26 Large-area external lead connection
27 Large-area external lead connection
28 Small-area external lead connection
29 Small-area external lead connection
30 Power semiconductor component
31 Underside of the power semiconductor component
32 Connecting element
33 Connecting element
34 Connecting element 35 Top side of the external leads
36 Edge side of the external leads
37 Plastic housing composition
$D_H$ Drain of the HSS
$D_L$ Drain of the LSS
$G_H$ Gate of the HSS
$G_L$ Gate of the LSS
HSS High-side switch
LSS Low-side switch
$S_H$ Source of the HSS
$S_L$ Source of the LSS
C Smoothing capacitor
L Inductance
$V_S$ Supply voltage
$V_0$ Ground potential
$\Delta V$ Voltage at the node of the bridge circuit

What is claimed is:

1. A power semiconductor component comprising a power semiconductor chip stack, the power semiconductor chip stack comprising:
   a base power semiconductor chip and a power semiconductor chip stacked on the rear side of the base power semiconductor chip, and a rewiring structure being arranged within a rear side metallization of the base power semiconductor chip; and
   a plurality of surface-mountable external lead connections,
   wherein the power semiconductor chip stack comprises a low-side switch and high-side switch in a bridge circuit, the power semiconductor chip stack having the low-side switch as the base power semiconductor chip and the high-side switch as the stacked power semiconductor chip, and a wiring film or wiring plate for a series circuit of the switches being arranged on the rear side of the base power semiconductor chip as the rewiring structure, and
   wherein the wiring film has on its underside at least one large-area drain contact pad for a drain electrode of the base power semiconductor chip and at least two contact pads on its top side as source and gate contact pads for source and gate electrodes, respectively, of the stacked power semiconductor chip, and the drain contact pad and the source contact pad being electrically connected to one another via through contacts through the wiring film,
   wherein the power semiconductor chip stack and the wiring film or the wiring plate are embedded in a plastic housing composition, and wherein the surface-mountable external lead connections are partially embedded in an underside of the plastic housing composition so that an underside of each of the surface-mountable external lead connections is free of the plastic housing composition.

2. The power semiconductor component according to claim 1, wherein the base power semiconductor chip and the stacked power semiconductor chip have vertical power field effect transistors with source, drain, and gate electrodes.

3. The power semiconductor component according to claim 1, wherein the plurality of surface-mountable external lead connections comprises a large-area source external lead connection being electrically connected to a source electrode of the base power semiconductor chip, a large-area drain external lead connection being electrically connected to a drain electrode of the stacked power semiconductor chip, a large-area drain/source external lead connection being electrically connected to the wiring film, and two smaller surface-mountable external lead connections in each case being electrically connected to a gate electrode of the base power semiconductor chip and the gate electrode of the power semiconductor chip stacked on the base power semiconductor chip.

4. The power semiconductor component according to claim 3, wherein the source electrode of the base power semiconductor chip is directly fixed on the large-area source external lead connection.

5. The power semiconductor component according to claim 3, wherein an internal connecting element electrically connects the drain electrode of the stacked power semiconductor chip to the large-area drain external lead connection.

6. The power semiconductor component according to claim 3, wherein the gate electrode of the base power semiconductor chip is directly fixed on one of the smaller surface-mountable external lead connections.

7. The power semiconductor component according to claim 3, wherein a second one of the smaller surface-mountable external lead connections is electrically connected to the gate electrode of the stacked power semiconductor chip via a connecting element.

8. The power semiconductor component according to claim 1, wherein an internal connecting element electrically connects the drain and source contact pads of the wiring film to one of the surface-mountable external lead connections that is a large-area drain/source external lead connection.

9. A power semiconductor chip stack comprising
   a first power semiconductor chip having a rear side metallization,
   a second power semiconductor chip stacked on the rear side of the first power semiconductor chip,
   a rewiring structure being arranged within the rear side metallization of the first power semiconductor chip,
   a low-side switch and high-side switch in a bridge circuit, the power semiconductor chip stack having the low-side switch as the first power semiconductor chip and the high-side switch as the second power semiconductor chip, and a wiring film or wiring plate for a series circuit of the switches being arranged on the rear side of the first power semiconductor chip as the rewiring structure, and
   a plurality of surface-mountable external lead connections,
   wherein the wiring film has on its underside at least one large-area drain contact pad for a drain electrode of the first power semiconductor chip and at least two contact pads as source and gate contact pads on its top side for source and gate electrodes, respectively, of the second power semiconductor chip, and the drain contact pad and the source contact pad being electrically connected to one another via through contacts through the wiring film,
   wherein the power semiconductor chip stack and the wiring film or the wiring plate are embedded in a plastic housing composition, and wherein the surface-mountable external lead connections are partially embedded in an underside of the plastic housing composition so that an underside of each of the surface-mountable external lead connections is free of the plastic housing composition.

10. The power semiconductor chip stack according to claim 9, wherein the first power semiconductor chip and the second power semiconductor chip have vertical power field effect transistors with source, drain, and gate electrodes.

11. The power semiconductor chip stack according to claim 9, wherein a source electrode of the first power semiconductor chip is directly fixed on one of the surface-mountable external lead connections that is a large-area source external lead connection.

12. The power semiconductor chip stack according to claim 9, wherein an internal connecting element electrically connects a drain electrode of the second power semiconductor chip to a one of the surface-mountable external lead connections that is a large-area drain external lead connection.

13. The power semiconductor chip stack according to claim 9, wherein a connecting strip or a preformed, structured connecting plate, as a clip, electrically connects the drain and source contact pads of the wiring film to one of the surface-mountable external lead connections that is a large-area drain/source external lead connection.

14. The power semiconductor chip stack according to claim 9, wherein a gate electrode of the first power semiconductor chip is directly fixed on one of the surface-mountable external lead connections.

15. The power semiconductor chip stack according to claim 9, wherein one of the surface-mountable external lead connections is electrically connected to a gate electrode of the second power semiconductor chip via a connecting element.

* * * * *